United States Patent [19]
Flory et al.

[11] Patent Number: 5,220,234
[45] Date of Patent: Jun. 15, 1993

[54] SHEAR TRANSVERSE WAVE DEVICE HAVING SELECTIVE TRAPPING OF WAVE ENERGY

[75] Inventors: Curt Flory, Los Altos; Waguih S. Ishak, Cupertino; Richard L. Baer, Los Altos, all of Calif.

[73] Assignee: Hewlett-Packard Company, Palo Alto, Calif.

[21] Appl. No.: 844,360

[22] Filed: Mar. 2, 1992

[51] Int. Cl.⁵ .................................. H01L 41/08
[52] U.S. Cl. ........................ 310/313 D; 310/313 B
[58] Field of Search .......... 310/313 D, 313 R, 313 A, 310/313 B, 318, 333, 348, 365, 366

[56] References Cited

U.S. PATENT DOCUMENTS

| | | | |
|---|---|---|---|
| 4,209,725 | 6/1980 | Dieulesaint et al. | 310/313 |
| 4,456,847 | 6/1984 | Minagawa et al. | 310/313 R |
| 4,773,138 | 9/1988 | Ballato et al. | 310/313 D X |
| 4,814,658 | 3/1989 | Suthers et al. | 310/313 D |
| 4,837,476 | 6/1989 | Michizuki | 310/313 R |
| 4,918,349 | 4/1990 | Shiba et al. | 310/313 C |
| 4,931,752 | 6/1990 | Bray et al. | 333/151 |
| 4,965,479 | 10/1990 | Elliott et al. | 310/313 D |

OTHER PUBLICATIONS

B. A. Auld et al., "Temperature Compensation of Surface Transverse Waves for Stable Oscillator Application," presented at IEEE Ultrasonics Symposium, Oct. 1987.

D. F. Thompson, "Temperature Compensation of Microwave Acoustic Resonators," doctoral dissertation for Stanford University, Jun. 1986.

Primary Examiner—Steven L. Stephan
Assistant Examiner—Ed To

[57] ABSTRACT

A shear transverse wave device having transitions in the relaxation or tightening of wave trapping. Two embodiments are preferably utilized simultaneously. A first embodiment involves wave trapping fingers disposed within a propagation region between a transmitting and a receiving interdigital transducer. The wave trapping fingers provide a high width-to-spacing ratio of fingers proximate to the transducers and provide a lower ratio with approach to a center of the propagation region. The relaxed trapping reduces the adverse effects caused by surface perturbations, while the tight trapping at the transducers provides an efficient coupling of power to and from the device. The second embodiment is likewise concerned with decoupling of power. Absorptive film is placed at the opposed edges of the device to suppress spurious reflections from the edges. A grating of fingers between each transducer and the associated edge is designed to provide a tightening of trapping with departure from the transducers, thereby allowing a more efficient absorption by the absorptive film, which is deposited on the fingers closest to the opposed edges. Again, the width-to-spacing ratio is varied to achieve the increase in wave trapping.

17 Claims, 2 Drawing Sheets

SHEAR TRANSVERSE WAVE DEVICE HAVING SELECTIVE TRAPPING OF WAVE ENERGY

DESCRIPTION

Technical Field

The present invention relates generally to shear transverse wave devices and more particularly to controlling the penetration of energy of a shear transverse wave.

Background Art

There are a number of types of piezoelectric devices that have been designed to perform electronic signal processing or to measure such variables as mass, pressure, viscosity and density. For example, a gravimetric sensor may be used to measure the concentration of a selected class of compounds in a chemical solution into which the sensor is immersed. Gravimetric sensors are also used in biological experimentation. As used herein, such piezoelectric devices are broadly classified as "bulk wave devices," "plate wave devices" or "surface wave devices."

A bulk wave device is one in which an acoustic wave tends to propagate and extend throughout the full thickness of a piezoelectric substrate. A plate wave device is one in which acoustic energy is confined by reflection from the top and bottom surfaces of a plate. A surface wave device is one in which acoustic energy is confined in a vertical direction (i.e. a direction perpendicular to a substrate surface) in a region adjacent to the substrate surface.

Each of the three classes can be subclassified by the orientation of the acoustic wave motion with regard to the substrate surface of the device. The three types of wave motion are: (1) longitudinal wave motion in which material displacement is in a direction parallel to the direction of propagation of the wave; (2) shear vertical wave motion in which material displacement is in a direction perpendicular to both the substrate surface and the direction of wave propagation; and (3) shear transverse, or shear horizontal, wave motion in which material displacement is perpendicular to the direction of propagation and parallel to the substrate surface.

A "Surface Acoustic Wave" (SAW) device is one type of surface wave device. This type is also known as a "Rayleigh Wave" (RW) device and utilizes waves that are predominantly shear vertical, with the energy localized within an acoustic wave length of the substrate surface. While this type operates efficiently in many applications, the shear vertical wave motion may adversely affect operation when used in such applications as gravimetric sensing of a liquid.

A "Surface Skimming Bulk Wave" (SSBW) device utilizes shear transverse wave motion. The Surface Skimming Bulk Wave type is also referred to as a "Shallow Bulk Acoustic Wave" (SBAW) device. Propagation occurs by way of bulk mode, in which the waves graze the surface and diffract into the piezoelectric substrate. Bulk propagating modes have higher velocities than Rayleigh waves, but are more susceptible to losses due to inefficient coupling of power to and from the substrate. Moreover, diffraction losses are significant.

"Love Wave" (LW) devices differ from an SSBW by the inclusion of a plate that functions as a surface trapping structure to trap the wave energy proximate to the surface of the piezoelectric substrate. Addition of the plate provides mass loading and causes piezoelectric shorting which slows down the skimming bulk shear wave, thereby creating a decay of the wave function into the depth of the substrate.

A "Surface Transverse Wave" (STW) device also utilizes shear horizontal wave motion. The STW device differs from the Love Wave device only by the replacement of the surface trapping plate with surface grooves or with a raised grating of fingers. The grating of fingers provides stronger surface trapping than the plate. Thus, high velocity bulk modes are further trapped near the surface of the substrate, allowing an even greater coupling of power through more efficient transduction.

Typically, an STW device includes a transmitting interdigital transducer having an array of interleaved electrode fingers to launch acoustic waves along the surface of a piezoelectric substrate in response to an electrical signal. A receiving interdigital transducer detects the acoustic waves and generates a corresponding output signal. The wave trapping fingers are located between the transmitting and receiving interdigital transducers. Additional gratings of wave trapping fingers may be used between a transducer and an edge of the piezoelectric substrate. An STW resonator is described in U.S. Pat. No. 4,965,479 to Elliott et al., which is assigned to the assignee of the present invention. The length of the wave trapping fingers is perpendicular to the direction of wave propagation and is determined by the length of the electrode fingers of the interdigital transducers. The limits of photolithography typically play a role in determining the width of the fingers, with the width of the fingers conventionally being equal to the spacing between adjacent fingers.

It is known that both the thickness of wave trapping fingers and the center-to-center distance, i.e. periodicity, of the fingers affect the penetration of shear transverse waves into an STW device. (See Auld et al., *IEEE Ultrasonics Symposium*, October 1987.) However, the period preferably is fixed, so as to restrict the effects of Bragg scattering to a small range of frequencies. The choice of the thickness of the fingers is a difficult and crucial parameter to choose properly, since there is a tradeoff of effects. On the one hand, a thick finger metallization yields tight trapping that allows efficient transduction and easy access to the high velocity bulk mode. On the other hand, the tight trapping has the disadvantage that the tightly trapped bulk mode is more sensitive to surface perturbations such as contaminants and discontinuities. Moreover, additional trapping is associated with additional slowing of the bulk mode. Because the metal deposition process is typically to be completed in a single lithographic step, the metal thickness is required to be uniform across the entire substrate surface.

There are two types of wave reflection that can negatively impact operation of an STW device. Firstly, within the propagation region between the transmitting interdigital transducer and the receiving interdigital transducer, there may be substrate inhomogeneities that cause perturbations. Secondly, reflections from the opposed edges of the STW device will constructively and destructively interfere with wave propagation from the transmitting interdigital transducer to the receiving interdigital transducer. One scheme used to suppress reflections from substrate edges is to angle the edges of the substrate, thereby causing reflection of the waves into a direction away from the interdigital transducers. The choice of the reflection-suppressing angle is important because multiple reflections along the surface of the STW device create a high probability of interference with main wave propagation. Another scheme in suppressing spurious reflection from substrate edges is to roughen the substrate at areas near the edges. However, this second scheme is both expensive and difficult to implement, since each chip of a wafer must then be treated separately. A third scheme is identified in a doctoral dissertation by D. F. Thompson, for Stanford University (June 1986) entitled "Temperature Compensation of Microwave Acoustic Resonators." The reflection is referred to as "grating edge reflection," which occurs because an STW sees an abrupt change in the wave impedance at the edge of the grating. The paper states that this impedance mismatch can be reduced by extending the grating beyond the transducer and slowly varying the wave impedance to match that of a free surface. Tapering the grating height is identified as one method of varying the wave impedance, while tapering the width of the wave trapping fingers is identified as a second possible method. Whether the height or the width is varied, the tapering is in a direction that allows the energy of the STW to be gradually diffracted into the bulk of the substrate. That is, each of the schemes of angling, roughening and tapering teaches diffracting the wave energy into the substrate.

It is an object of the present invention to provide a surface transverse wave device that is able to minimize the effects of reflections from substrate surface perturbations within the propagation region between transmitting and receiving interdigital transducers and that maximizes absorption of surface transverse wave energy directed at substrate edges.

SUMMARY OF THE INVENTION

The above object has been met by a surface transverse wave device which provides tight trapping of STW energy for efficient coupling of energy to and from a piezoelectric substrate and which provides a controlled but somewhat more relaxed trapping in areas of a propagation region in which trapping is an issue but transduction and absorption are not. The STW device includes the piezoelectric substrate having first and second opposed edges, with the propagation region between first and second transduction regions. A transmitting interdigital transducer is located within the first transduction region for coupling a signal to the piezoelectric substrate and a receiving interdigital transducer is located within the second transduction region for converting the STW energy into an output signal.

The present invention includes stepped wave trapping fingers for progressively drawing wave energy increasingly closer to the surface of the piezoelectric substrate for absorption or transduction. In one embodiment, the widths of the wave trapping fingers are stepped within the propagation region between the first and second transduction regions. The period and the thickness of the fingers are generally uniform throughout the propagation region. However, the ratio of the widths of the fingers to the spacing between adjacent fingers is tapered with departure from each of the interdigital transducers to a minimum at the center of the propagation region. That is, the STW energy is tightly trapped within areas of the propagation region proximate to the interdigital transducers and is less tightly trapped with departure from the transducers. The tight trapping ensures efficient transduction between an electrical signal and the STW. An advantage of this embodiment is that the reduced width-to-space ratio at the intermediate area of the propagation region reduces the effects of substrate surface perturbations, allowing a signal with minimal distortion and minimal propagation loss.

In a second embodiment which is preferably utilized with the first embodiment, wave trapping fingers are located between each interdigital transducer and the associated edge of the piezoelectric substrate. The width-to-space ratio is increased, while keeping the period of the fingers constant, with departure from the interdigital transducers, thereby drawing the STW energy increasingly closer to the substrate surface. A structure, such as a polyimide film, may then be used to absorb the waves. Thus, the wave energy is removed from the piezoelectric substrate prior to reaching the substrate edges so as to further reduce spurious reflections.

An advantage of the present invention is that selective variation of the width-to-space ratio of wave trapping fingers in the manner described above provides an improvement in the signal-processing or sensing performance of the STW device. Another advantage is that the STW device may be fabricated using conventional photolithographic processing to achieve the increase in the suppression of spurious reflection. That is, the improvement is achieved without any significant effect on the cost of fabrication.

BEST MODE FOR CARRYING OUT THE INVENTION

Figure 1:
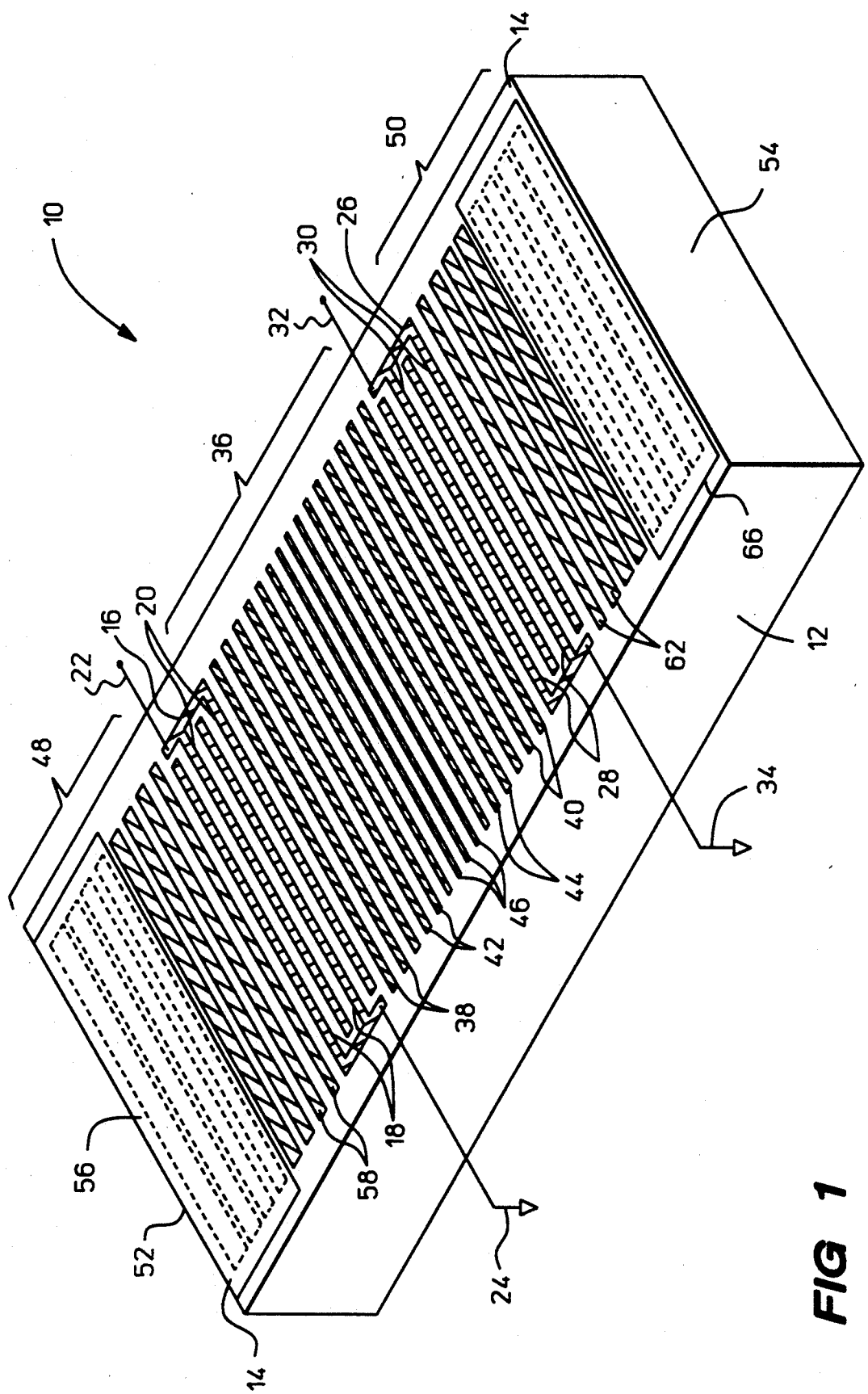
FIG. 1 is a perspective view of a surface transverse wave device in accord with the present invention.
Figure 2:
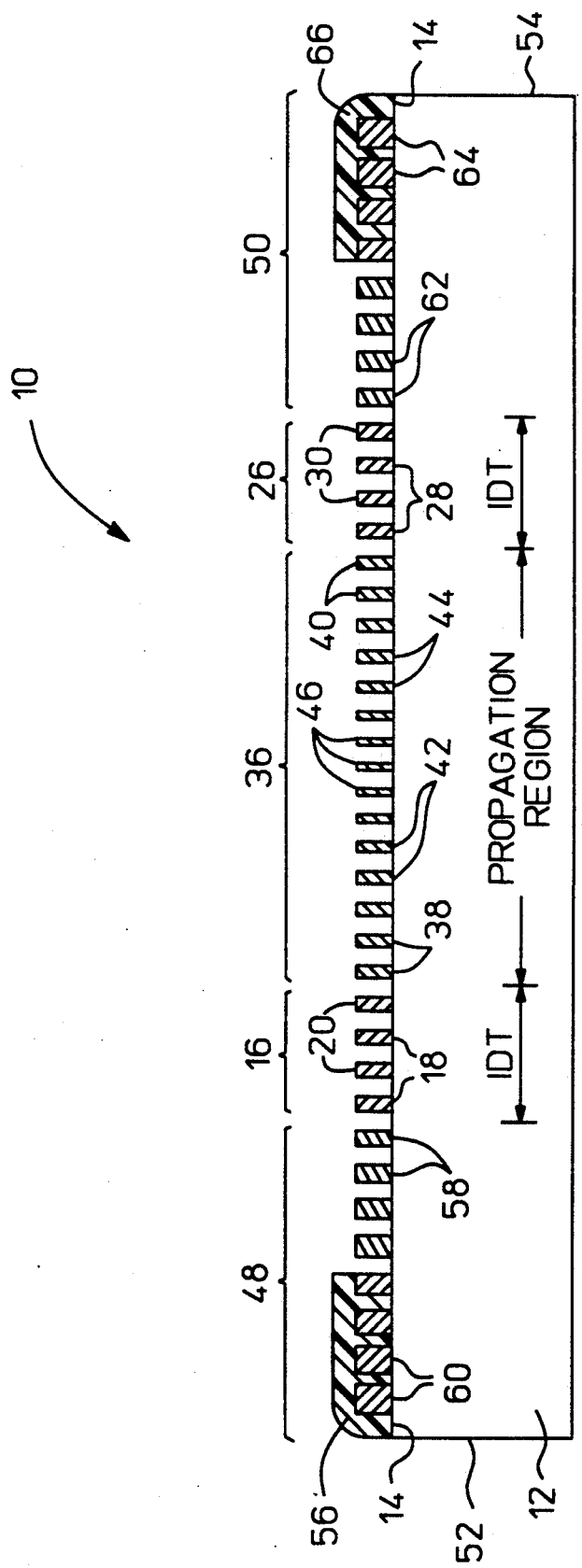
FIG. 2 is a side sectional view of the surface transverse wave device of FIG. 1.

With reference to FIGS. 1 and 2, a surface transverse wave (STW) device 10 includes a piezoelectric substrate 12 having a substrate surface 14 for the propagation of shear transverse, or shear horizontal, wave motion in which displacement of piezoelectric material is perpendicular to the direction of propagation and parallel to the substrate surface. The piezoelectric material may be quartz, $LiTaO_3$, $LiNbO_3$, or another material known in the art. The substrate is cut to couple energy from a transmitting interdigital transducer 16 into shear transverse waves. The choice of substrate material and the cut are also selected to enable trapping of wave energy at the substrate surface 14.

The transmitting interdigital transducer 16 includes a number of electrode fingers 18 and 20. The electrode fingers are made of a conductive material, such as aluminum, which is deposited and photolithographically patterned on the substrate surface 14. The deposition of the conductive material which forms the electrode fingers, and the other conductive members to be described below, is provided by conventional methods, such as evaporation or sputter deposition. An applied voltage difference between an input line 22 and a ground 24 produces an electric field that interacts electromechanically with the piezoelectric substrate 12 to launch surface transverse waves along a propagation region of the piezoelectric substrate.

The transmitting interdigital transducer 16 launches acoustic waves along a propagation path to a receiving interdigital transducer 26 having electrode fingers 28 and 30. The receiving interdigital transducer is connected to an output line 32 and to ground 34 to provide electrical output signals corresponding to the received acoustic waves.

In operation, an alternating voltage is supplied to the transmitting interdigital transducer 16 to provide an electric field between electrode fingers 18 and electrode fingers 20. A stress field is generated by the electromechanical action in the piezoelectric substrate 12. Because of the particular crystalline structure of the piezoelectric substrate, this stress field generates shear transverse waves at the designed frequency. The shear transverse waves propagate toward the receiving interdigital transducer 26 to create an electric field between electrode fingers 28 and electrode fingers 30, producing an output signal at the output line 32.

Shear transverse waves have an inherent characteristic of diffracting into the bulk of the piezoelectric substrate 12 as the waves propagate from the transmitting interdigital transducer 16 to the receiving interdigital transducer 26. An array 36 of wave trapping fingers is provided within the propagation region between the transducers to trap the wave energy to within a few wavelengths of the substrate surface 14. Typically, the array 36 is a photolithographically patterned layer of metal, such as aluminum. However, other materials may be used, such as silicon dioxide. The wave trapping fingers of the array 36 slow the shear transverse waves, thereby creating a decay of the wave function into the depth of the piezoelectric substrate 12. This "slowing effect" that creates the trapping is due to the multiple reflections from the individual fingers of the array 36. Because metals are particularly dense, metallic fingers can be thinner than functionally comparable wave trapping fingers of other materials. In addition, metallic arrays can short out the piezoelectric substrate 12 at its upper surface, thereby reducing the stiffness of the substrate at its upper surface. This provides increased trapping of shear transverse waves.

The center-to-center distance, or periodicity, of the wave trapping fingers within the array 36 is typically equal to the periodicity of the electrode fingers 18, 20, 28 and 30 of the transmitting and receiving interdigital transducers 16 and 26. For example, the period of the fingers of the array 36 and the transducers 16 and 26 may be four microns. It is recognized that the period of the wave trapping fingers within the array 36 will affect the degree of trapping. However, the period should be fixed in order to restrict the effects of Bragg scattering of the STW to a small range of frequencies.

It is also recognized that the thickness, or height, of the wave trapping fingers within the array influences the penetration of wave energy. The thicker metallization provides a tighter trapping. However, typically the fingers have a uniform thickness, since different thicknesses would require additional or more complicated processing steps during the fabrication of the surface transverse wave device 10.

Tight trapping of wave energy reduces attenuation of the signal and increases the coupling of power to and from the interdigital transducers 16 and 26. One problem with tight trapping is that it will enhance the adverse effects of an STW propagating through an inhomogeneity within or on the piezoelectric substrate. For example, there may be a contaminant on the substrate surface 14 which causes undesirable perturbations of the wave. Discontinuities will have the same effect. Thus, in choosing the optimal period and the optimal thickness of the array 36 of fingers, there is a tradeoff between the coupling of power and the susceptibility of the STW device 10 to perturbations generated by contaminants and discontinuities.

The present invention significantly reduces the necessity for this tradeoff. It has been discovered that a highly efficient coupling can be maintained and susceptibility to perturbations can be reduced by selectively varying the ratio of the width of the fingers in the array 36 to the spacing between adjacent fingers. The width-to-spacing ratio is greatest for the fingers 38 and 40 immediately adjacent to the interdigital transducers 16 and 26. The ratio should be generally equivalent to that of the electrode fingers 18, 20, 28 and 30, since an abrupt transition would create a reflection-inducing discontinuity that would affect the performance of the STW device 10. The width-to-spacing ratio is gradually reduced as the fingers 42 and 44 approach the center of the propagation region of the substrate. The ratio is at a minimum for fingers 46 that are located generally equally between the two interdigital transducers 16 and 26.

While only fifteen fingers 38-46 are shown within the array 36, typically the propagation region of the piezoelectric substrate 12 includes a greater number. The period and the thickness of the fingers are uniform, but the width-to-spacing ratio gradually varies. The ratio may be uniform for segments of the propagation region, as for example the center of the propagation region.

In operation, an input signal enters at the input line 22 and the energy is converted to a series of shear transverse waves directed toward the receiving interdigital transducer 26. The wide fingers 38 provide a width-to-spacing ratio that facilitates efficient coupling of power to the piezoelectric substrate 12. The transition of the ratio that occurs along the wave trapping fingers 42 and 46 allows an increasing penetration of the shear transverse wave into the piezoelectric substrate 12. This increased penetration reduces the susceptibility of the device 10 to perturbations generated from contaminants and discontinuities. The ratio is then ramped up to increase the trapping with approach to the receiving interdigital transducer 26. Thus, the coupling of power to the receiving interdigital transducer is enhanced.

For a given grating periodicity (p=0.475 times the wavelength ($\lambda$) of STWs) and a given grating height (h=0.01 p), the following results were computationally determined for different ratios (r) of finger width-to-p:

CASE 1—Where r=0.4, the STW power decays to 25% of its substrate surface value at a depth of 7$\lambda$;

CASE 2—Where r=0.5, the STW power decays to 25% of its substrate surface value at a depth of 6$\lambda$;

CASE 3—Where r=0.6, the STW power decays to 25% of its substrate surface value at a depth of 4$\lambda$;

CASE 4—Where r=0.8, the STW power decays to 25% of its substrate surface value at a depth of 3$\lambda$; and CASE 5—Where r=1.0, the STW power decays to 25% of its substrate surface value at a depth of 2$\lambda$.

The above-described variation in the width-to-spacing ratio is one embodiment of the present invention. A second embodiment, which is preferably utilized simultaneously with the first embodiment, is also shown in FIGS. 1 and 2. The second embodiment involves tapering of the width-to-spacing ratio of wave trapping fingers within gratings 48 and 50 proximate to opposed edges 52 and 54 of the piezoelectric substrate 12. The transmitting interdigital transducer 16 launches shear transverse waves in opposite directions simultaneously.

The receiving interdigital transducer 26 is capable of receiving the waves from either direction. As a result, reflections from the first and second edges 52 and 54 of the piezoelectric substrate 12 produce unwanted reflections that distort the main, desired signal. The gratings 48 and 50 are designed to reduce reflections which would otherwise adversely affect the performance of the device 10.

The gratings 48 and 50 of the present invention are designed to prepare the waves for decoupling of power from the piezoelectric substrate 12 prior to the first and second edges 52 and 54. Waves launched from the transmitting interdigital transducer 16 are progressively more tightly trapped as they depart from the transducer and near the first edge 52. This tightening of the trapping readies the waves for absorption by an absorptive material, such as a polyimide film 56. The increase in trapping is achieved by varying the width-to-spacing ratio of fingers within the grating 48. The grating fingers 58 adjacent to the transmitting interdigital transducer 16 should have a width-to-spacing ratio that is generally equivalent to the width-to-spacing ratio of the transducer electrode fingers 18 and 20. This equivalence ensures that shear transverse waves do not encounter a discontinuity that would cause reflections. However, the grating fingers 60 further from the transmitting interdigital transducer 16 increase in width, thereby providing the tighter trapping. The absorptive material of film 56 is deposited on the grating fingers to absorb the unwanted waves launched towards the first edge 52. Other absorbent materials include RTV (room-temperature vulcanizing silicone rubber), black wax and epoxy resin. These absorptive materials are presently used in Surface Acoustic Wave (SAW) devices and are described in U.S. Pat. No. 4,931,752 to Bray et al., which is assigned to the assignee of the present invention and is incorporated herein by reference.

A similar progressive increase of the width-to-spacing ratio of fingers 62 and 64 is provided within the grating 50 between the receiving interdigital transducer 26 and the second edge 54. As the ratio is increased with departure from the transducer 26, wave energy is more tightly trapped so as to provide more efficient absorption by a polyimide film 66. In the same manner as the absorptive film 56, the absorptive film 66 may be made of a material other than polyimide. The wave energy is drawn up to a wavelength or less from the substrate surface 14, allowing the more efficient absorption of shear transverse waves.

We claim:

1. A shear transverse wave device comprising,
   a piezoelectric means having a substrate surface for supporting shear transverse wave propagation, said substrate surface having opposed first and second edges and having first and second transduction regions and a propagation region between said first and second transduction regions,
   a transmitting interdigital transducer within said first transduction region, said transmitting interdigital transducer having transmitting electrode fingers, each having a first width parallel to said substrate surface and to the direction of said shear transverse wave propagation,
   a receiving interdigital transducer within said second transduction region,
   first stepped wave trapping means for progressively drawing wave energy of a shear transverse wave increasingly closer to said substrate surface with an approach to one of said first and second edges, said first stepped wave trapping means being spaced apart from said first and second transduction regions and having an array of spaced apart first trapping fingers having a uniform period, a ratio of widths of said first trapping fingers to spacing between said first trapping fingers increasing with said approach to one of said first and second edges, said increase of said ratio thereby drawing said wave energy toward said substrate surface for efficient removal of said wave energy from said piezoelectric means, and
   second wave trapping means within said propagation region for controllably releasing wave energy from said substrate surface with departure from said transmitting interdigital transducer and redrawing said wave energy toward said substrate surface with approach to said receiving interdigital transducer, said second wave trapping means having second trapping fingers having varying widths to provide said releasing and redrawing of wave energy.

2. The device of claim 1 wherein said transmitting electrode fingers and said first and second trapping fingers are metallic members disposed on said substrate surface, said transmitting electrode fingers and said first and second trapping fingers having a generally uniform thickness, said thickness being normal to said substrate surface.

3. The device of claim 1 wherein said first stepped wave trapping means is between said receiving interdigital transducer and said second edge, said first trapping fingers having widths that increase with departure from said receiving interdigital transducer.

4. The device of claim 3 further comprising a wave energy absorbing means proximate to said second edge for absorbing wave energy directed toward said second edge.

5. The device of claim 1 wherein the widths of second trapping fingers proximate to one of said transmitting and receiving interdigital transducers are greater than the widths of second trapping fingers proximate to a center of said propagation region.

6. The device of claim 1 wherein said receiving interdigital transducer includes receiving electrode fingers.

7. The device of claim 3 further comprising a third wave trapping means disposed between said first edge and said transmitting interdigital transducer for progressively decreasing the depth of penetration of shear transverse wave energy with departure from said transmitting interdigital transducer.

8. A shear transverse wave device comprising,
   a substrate having a first surface and having opposed first and second edges,
   transmitting means disposed on said first surface for launching a surface transverse wave along a propagation path in response to an input signal,
   receiving means disposed along said propagation path for generating an output signal in response to wave energy received thereat, and
   a wave trapping means positioned along said propagation path between said transmitting means and said receiving means for controlling the depth of penetration of surface transverse wave energy along said propagation path, said wave trapping means having a plurality of trapping fingers having widths generally parallel to said propagation path, the widths of trapping fingers proximate to said transmitting means and the widths of trapping fingers proximate to said receiving means each being greater than the widths of trapping fingers in a region located centrally between said transmitting and receiving means, thereby allowing greater penetration of said surface transverse wave energy at said centrally located region and less penetration proximate to said receiving means.

9. The device of claim 8 wherein said trapping fingers have widths that decrease substantially correspondingly with the distance from the transmitting means and from the receiving means to a minimum at a midpoint between said transmitting means and said receiving means.

10. The device of claim 8 wherein said substrate is a piezoelectric substrate and said transmitting means and said receiving means are each interdigital transducers having electrode fingers, the thickness of said electrode fingers being substantially the same as the thickness of said trapping fingers.

11. The device of claim 8 wherein said trapping fingers are metallic members on said first surface.

12. The device of claim 8 further comprising absorptive means disposed between said transmitting means and said first edge for absorbing wave energy propagating toward said first edge, said absorptive means including a plurality of second trapping fingers having varying widths increasing with approach to said first edge.

13. The device of claim 8 wherein said trapping fingers have a uniform center-to-center distance.

14. A shear transverse wave device comprising, a substrate having a first surface and having opposed first and second edges, transmitting means disposed on said first surface for launching a shear transverse wave along a propagation path in response to an input signal, receiving means disposed along said propagation path for generating an output signal in response to wave energy received thereat, first and second patterns of fingers disposed on said first surface, said first pattern being between said transmitting means and said first edge, said second pattern being between said receiving means and said second edge, said fingers each having a finger width parallel to said propagation path, said finger widths of each of said first and second patterns increasing with increasing distance from said transmitting means and said receiving means, thereby drawing wave energy closer to said first surface with approach to said first and second edges, and means disposed adjacent to said first and second edges of said substrate for absorbing said wave energy drawn to said first surface by said first and second patterns.

15. The device of claim 14 wherein said fingers of said first and second patterns have a uniform period.

16. The device of claim 15 wherein said fingers have a uniform thickness as measured perpendicular to said first surface.

17. The device of claim 14 wherein said fingers are metallic members.

* * * * *